United States Patent [19]

Hoffman

[11] Patent Number: 4,982,315
[45] Date of Patent: Jan. 1, 1991

[54] VOLTAGE MULTIPLIER CIRCUIT

[75] Inventor: John P. Hoffman, Peoria, Ill.

[73] Assignee: Caterpillar Inc., Peoria, Ill.

[21] Appl. No.: 495,503

[22] Filed: Mar. 19, 1990

[51] Int. Cl.$^5$ .............................................. H02M 7/25
[52] U.S. Cl. ...................................... 363/60; 307/270; 307/576
[58] Field of Search ............................ 363/59, 60, 61; 307/270, 571, 576; 230/110, 1

[56] References Cited

U.S. PATENT DOCUMENTS

| | | | |
|---|---|---|---|
| 4,106,086 | 8/1978 | Holbrook et al. | 363/60 |
| 4,344,003 | 8/1982 | Harmon et al. | 307/296 |
| 4,769,753 | 9/1988 | Knudson | 363/60 |
| 4,888,677 | 12/1989 | Grimm et al. | 363/60 |
| 4,926,354 | 5/1990 | Pattantyus | 363/60 |

Primary Examiner—Peter S. Wong
Attorney, Agent, or Firm—Kirk A. Vander Leest

[57] ABSTRACT

A signal generator is provided for delivering non-overlapping charge and discharge signals to a voltage multiplier circuit. The multiplier circuit has a discharge switch for receiving the discharge signal and connecting a booster capacitor in series with an input voltage source and in parallel with a storage capacitor, thereby transferring charge from the booster capacitor to a storage capacitor. The multiplier circuit further includes charge switch which receives the charge signal and delivers the input voltage potential to the booster capacitor for charging. The signal generator advantageously provides an interval of time between the charge and discharge signals, thereby preventing sporadic discharges from the booster capacitor and undesirable power losses.

6 Claims, 2 Drawing Sheets

Fig_1

VOLTAGE MULTIPLIER CIRCUIT

TECHNICAL FIELD

This invention relates to an improvement in voltage multiplying circuits and more particularly to an apparatus for delivering non-overlapping switching signals to first and second switches of a voltage multiplying circuit.

BACKGROUND ART

In the voltage multiplying circuit of the type involved in this application, a switching means cyclically connects a booster capacitor in parallel with an input voltage source for charging during a "charging" portion of an operating cycle, and during a "discharge" portion of the operating cycle the booster capacitor is switched into a series connection with the input voltage source across a storage capacitor. Since the potential across the booster capacitor cannot change instantaneously after switching, the booster capacitor serves as an additional voltage source during its serial connection with the input voltage source, thereby augmenting or "boosting" the potential applied to the storage capacitor. More particularly, charge is transferred from the booster capacitor to the storage capacitor thereby charging the storage capacitor to a predetermined voltage level which is ideally a multiple of the potential supplied by the input voltage source. Thereafter charge is cyclically transferred to the storage capacitor in the above manner to keep it charged to the predetermined voltage level. The storage capacitor continually supplies the multiplied potential to external circuitry and, therefore, its charge must be replenished in the above manner to make up for the current consumed by the external circuitry.

The switching means in such circuits commonly include charge and discharge switches which are responsive to respective charge and discharge control signals. More particularly, the charge switch connects the booster capacitor in parallel with the input voltage source in response to receiving the charge control signal, thereby charging the booster capacitor to a predetermined voltage. The discharge switch means receives the discharge control signal and connects the booster capacitor in series with the input voltage source across the storage capacitor, thereby transferring charge from the booster capacitor to the storage capacitor. In these prior systems it is possible for the charge and discharge signals to overlap, thereby simultaneously biasing the switches "on" for a period of time. If this occurs, spurious and undesirable discharge of the capacitors can result. Furthermore, if the switches are serially connected across the input voltage source, simultaneous operation of the switches can result in large current spikes and undesirable power losses.

A prior system which anticipates this problem is disclosed in U.S. Pat. No. 4,106,086 which issued Aug. 8, 1978 to Holbrook et al. In Holbrook et al. a circuit is disclosed which relies on a difference between transconductances of individual transistors to produce non-overlapping control signals. However, since the transconductance of a transistor determines its switching time, transistor manufacturers continually strive to increase the transconductance in an attempt to reduce the transistor switching times. Therefore, it is both costly and difficult to find commercially available transistors whose transconductances differ to the extent necessary to allow the Holbrook et al. circuit to function in the manner disclosed. It is possible to control the transconductances as required by Holbrook et al. if the circuit is manufactured using integrated circuit (IC) technology. However, integrated circuits are costly to develop and therefore uneconomical for low-production applications.

The present invention is directed to overcoming one or more of the problems as set forth above by providing a circuit for generating non-overlapping control signals which can be readily manufactured using commercially available components.

DISCLOSURE OF THE INVENTION

In one aspect of the present invention a signal generator is provided for delivering non-overlapping charge and discharge signals to a voltage multiplier circuit of the type having a source, a storage capacitor across which output voltage is produced, and a booster capacitor. The multiplier circuit includes a discharge switch for receiving the discharge signal and connecting the booster capacitor in series with an input voltage source and in parallel with the storage capacitor for transferring charge from the booster capacitor to the storage capacitor. The multiplier circuit further includes a charge switch for receiving the charge signal and delivering the input voltage to the booster capacitor for charging.

The signal generator includes an oscillator for producing a rectangular-wave signal which varies at a preselected frequency. A first circuit receives the rectangular-wave signal and produces a first modified signal having rise and decay times responsive respectively to leading and trailing edges of the rectangular-wave signal. A second circuit receives rectangular-wave signal and produces a second modified signal having rise and decay times responsive respectively to leading and trailing edges of the rectangular-wave signal. The first modified signal rise time is longer than the second modified signal rise time, and the first modified signal decay time is shorter than the second modified signal decay time. A third circuit receives the first modified signal and produces the discharge signal. The discharge signal has leading and trailing edges responsive respectively to the first modified signal rise and decay times during a single cycle of the rectangular-wave signal. A fourth circuit receives the second modified signal and produces the charge signal. The second control signal has a leading edge responsive to the second modified signal decay time of one cycle of the rectangular-wave signal and a trailing edge responsive to the second modified signal rise time of a succeeding cycle of the rectangular-wave signal. Therefore, an interval of time occurs between the production of the charge and discharge signals.

BEST MODE FOR CARRYING OUT THE INVENTION

Figure 2:
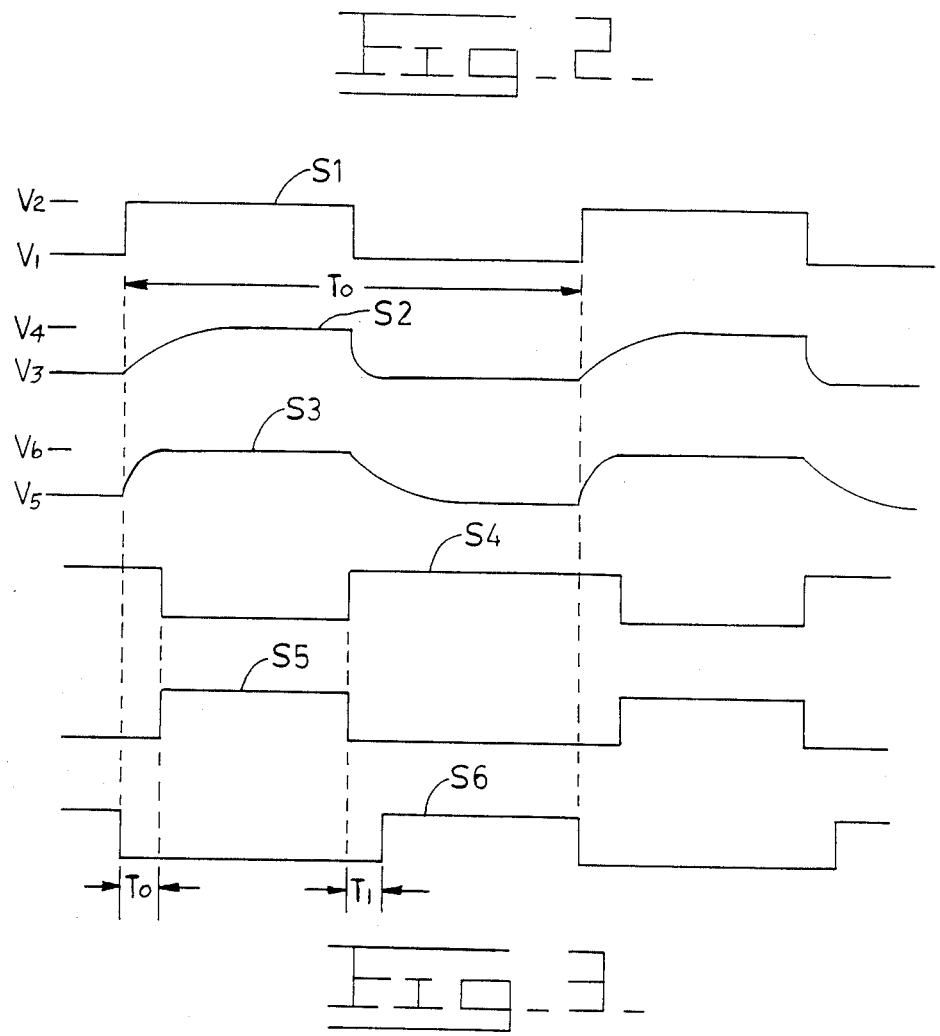
FIG. 2 is a graph illustrating waveforms of various signals which are produced by the circuit of FIG. 1.

Referring now to the drawing figures, a preferred embodiment of the immediate signal generator 10 is shown. Waveforms of various signals produced by the signal generator 10 are shown in FIG. 2, and these waveforms will be referenced throughout the following description of the signal generator 10. The signal generator 10 repeatedly delivers non-overlapping charge and discharge signals S6,S5 to a voltage multiplier circuit 12 at a preselected frequency. The voltage multiplier circuit 12 is further supplied with an input voltage potential $V_B$ from an electrical power source such as a battery 13, for example, and it produces an output voltage potential $V_B+V_C$ which is greater in magnitude than the input voltage potential $V_B$ at an output terminal 14 in response to the received signals S5,S6 and the input voltage potential $V_B$.

The signal generator 10 includes an oscillator means 16 which produces a rectangular-wave signal S1 which alternates between first and second voltage levels V1, V2 at a preselected frequency. In the preferred embodiment the oscillator means 16 is a square-wave oscillator 17, as is common in the art.

A first means 18 receives the rectangular-wave signal S1 from the oscillator means 16 and produces a first modified signal S2 which varies between third and fourth voltage levels V3,V4. The first modified signal S2 has rise and decay times responsive to leading and trailing edges of the rectangular-wave signal S1. The first means 18 includes a first R-C circuit 20 having an input terminal 22 connected to the oscillator means 16 for receiving the rectangular-wave signal S1, and an output terminal 24 adapted to produce the first modified signal S2. The first R-C circuit 20 further includes a first resistor 26 serially connected between the first R-C circuit input and output terminals 22,24, and a first capacitor 28 connected between the first R-C circuit output terminal 24 and a negative reference terminal 30 of the power source $V_B$. A first diode 32 has a cathode and an anode respectively connected to the first R-C circuit input and output terminals 22,24.

A second means 34 also receives the rectangular-wave signal S1 from the oscillator means 16 and produces a second modified signal S3 which varies between fifth and sixth voltage levels V5,V6. The second modified signal S3 has rise and decay times responsive respectively to leading and trailing edges of the rectangular-wave signal S1. The second means 34 includes a second R-C circuit 36 having an input terminal 38 connected to the oscillator means 16 for receiving the rectangular-wave signal S1, and an output terminal 40 adapted to produce the second modified signal. The second R-C circuit 36 further includes a second resistor 42 connected between the second R-C circuit input and output terminals 38,40, and second capacitor 44 connected between the second R-C circuit output terminal 40 and the power source negative reference terminal 30. A second diode 46 has an anode and a cathode respectively connected to the second R-C circuit input and output terminals 38,40.

As can be seen in FIG. 2, the first modified signal S2 has a longer rise time than that of the second modified signal S3, and the first modified signal S2 has a decay time which is shorter than that of the second modified signal S3. This is because of the orientation of the first and second diodes 32,46 with respect to the input and output terminals of the first and second R-C circuits 20,36, respectively. More particularly, the leading edge of the rectangular-wave signal S1 biases the first diode "off", causing the first capacitor 28 to be charged through the first resistor 26. Thus, the rise time of the first modified signal S2 is determined by the ohmic value of the first resistor 26. However, the second diode 46 is biased "on" by the leading edge of the rectangular-wave signal S1, thereby charging second capacitor 44 directly through the second diode 46. Because of the manner in which the capacitors 28,44 are charged, the rise time of the first modified signal S2 is longer than the second modified signal's S3 rise time.

Conversely, the first diode 32 is biased "on" by the trailing edge of the rectangular-wave signal S1, thereby allowing the first capacitor 28 to rapidly discharge through the first diode 32. Simultaneously, the second diode 46 is biased "off" by the falling edge of the rectangular-wave signal, thereby blocking current flow from the second capacitor 44 and causing it to discharge through the second resistor 42. Thus, the decay time of the second modified signal S3 is responsive to the ohmic value of the second resistor 42. Because of the respective discharge paths of the capacitors 28,44, the first modified signal S2 has a shorter decay time than the second modified signal S3.

A third means 48 receives the first modified signal S1 from the first means 18 and produces a discharge signal S5. The discharge signal S5 has leading and trailing edges responsive respectively to the first modified signal's S2 rise and decay times during a single cycle of the rectangular-wave signal S1. The third means 48 includes a first inverter 50 having an input terminal connected to the first R-C circuit output terminal 24 and an output terminal adapted for producing a first inverted signal S4. The first means further includes a second inverter 56 having an input terminal connected to the first inverter's 50 output terminal for receiving the first inverted signal S4, and an output terminal adapted to produce the discharge signal S5. The switching thresholds of the first and second inverters 50,56 are advantageously selected such that production of the discharge signal S5 is responsive to the first modified signal's S2 rise and decay times. More specifically, the inverters 50,56 are chosen to have switching thresholds which are between the third and fourth voltage levels V3,V4 of the first modified signal. Because the first modified signal S2 does not immediately rise to the fourth voltage level V4, the leading edge of the discharge signal S5 occurs a first period of ti $T_0$ after the leading edge of the rectangular-wave signal S1. This time period $T_0$ corresponds to the time it takes the first modified signal V2 to reach the switching threshold of the inverters 50,56. Furthermore, because the first modified signal S2 decays rapidly to the third voltage level V3, there is no substantial delay between the trailing edges of the rectangular-wave and discharge signals S1,S5.

A fourth means 58 receives the second modified signal S3 from the second means 34 and produces a charge signal S6. As can be seen in FIG. 2, the charge signal S6 has a leading edge responsive to the second modified signal's S3 decay time of one cycle of the rectangular-wave signal S1 and a trailing edge responsive to the second modified signal's S3 rise time of a succeeding cycle of the rectangular-wave signal S1. The fourth means 58 includes a third inverter 60 having an input terminal connected to the second R-C circuit output terminal 40 for receiving the second modified signal S3, and an output terminal adapted to produce the charge signal S6. The switching threshold of the third inverter 60 is advantageously selected such that production of the charge signal S6 is responsive to the second modified signal's S3 rise and decay times. More specifically, the third inverter 60 is chosen to have a switching threshold which is between the fifth and sixth voltage levels V5,V6 of the second modified signal S3. The leading edge of the charge signal S6 is delayed for a second period of time $T_1$ after the trailing edge of the rectangular-wave signal S1. The second time period $T_1$ corresponds to the time it takes the first modified signal S2 to reach the switching threshold of the inverter 60. However, because the second modified signal S3 rises rapidly from the fifth voltage level V5 to the sixth voltage level V6, there is no substantial time delay between the rising edge of the rectangular-wave signal S1 and the falling edge of the charge signal S6. As can be seen in FIG. 2, the above-described embodiment of the signal generator 10 ensures that the desired time intervals $T_0$, $T_1$ occur between the signals S6,S5.

Figure 1:
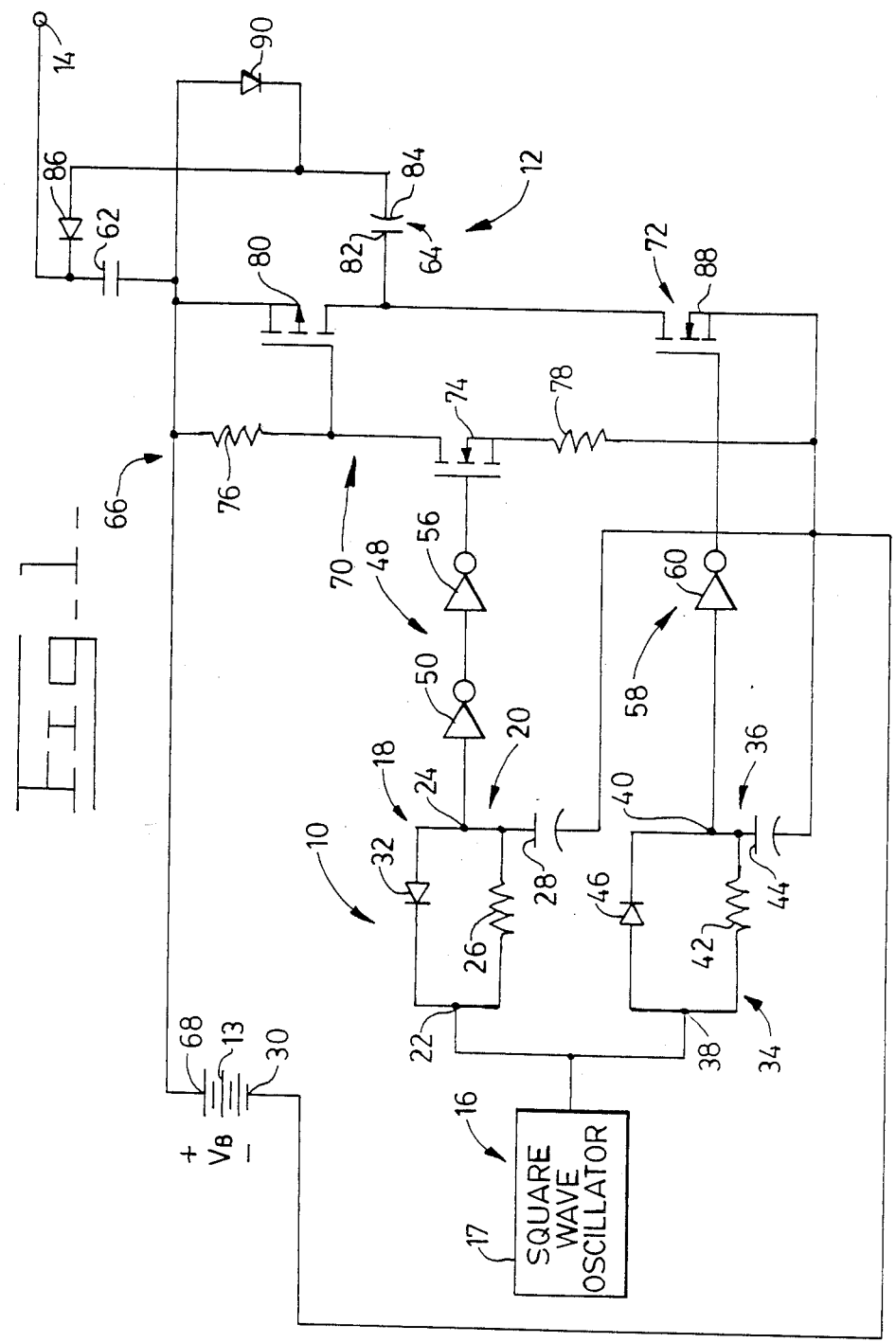
FIG. 1 is an electrical schematic illustrating one embodiment of the immediate invention adapted for use with a voltage multiplying circuit.

The voltage multiplier circuit 12 shown in FIG. 1 will now be described. It should be understood that the multiplier circuit 12 forms no part of the immediate invention and that the signal generator 10 could be used in any electrical circuit where non-overlapping switching signals are desired. The multiplier circuit 12 is of a type common in the art and it includes a storage capacitor 62 across which a predetermined voltage potential $V_C$ is produced and a booster capacitor 64 which is used to build up and thereafter maintain the storage capacitor 62 at the predetermined voltage potential $V_C$. The multiplier circuit 12 has an input terminal 66 connected to a positive reference terminal 68 of the power source 13 for receiving an input voltage potential $V_B$. The circuit 12 further includes discharge and charge switch means 70,72 for receiving the discharge and charge signals S5,S6, respectively. The circuit 12 produces an output voltage potential $V_B+V_C$ which is greater in magnitude than the input voltage potential $V_B$ at the output terminal 14 in response to the charge and discharge signals S6,S5 and the input voltage potential $V_B$.

More specifically, the charge switch means 72 receives the charge signal S6 and delivers the input voltage potential to the booster capacitor 64 thereby charging the booster capacitor 64. The discharge switch means 70 receives the discharge signal S5 and connects the booster capacitor 64 in series with the power source 13 across the storage capacitor 62, thereby transferring charge from the booster capacitor 64 to the storage capacitor 62. The signals S6,S5 are repeatedly applied to the charge and discharge switch means 72,70 at a preselected frequency to maintain the multiplier circuit output terminal 14 at the output voltage potential level $V_B+V_C$.

In the preferred embodiment, the discharge switch means 70 includes a first n-channel MOSFET 74 having a gate connected to the second inverter's 56 output terminal for receiving the discharge signal S5, a drain connected to the power source positive reference terminal 68 through a third resistor 76, and a source connected to the power source negative reference terminal 30 through a fourth resistor 78. The discharge means 70 further includes a p-channel MOSFET 80 having a gate connected to the junction of the first n-channel MOSFET's 74 drain and the third resistor 76, a source connected to the power source positive reference terminal 68, and a drain connected to a first plate 82 of the booster capacitor 64. The booster capacitor 64 further has a second plate 84 connected to the multiplier circuit output terminal 14 through a third diode 86. More particularly, the third diode 86 has an anode connected to the capacitor second plate 84 and a cathode connected to the multiplier circuit output terminal 14.

The charge switch means 72 includes a second n-channel MOSFET 88 having a gate connected to the output terminal of the third inverter 60 for receiving the charging signal S6, a drain connected to the junction of the p-channel MOSFET's 80 drain and the booster capacitor first plate 82, and a source connected to the power source negative reference terminal 30.

A fourth diode 90 has an anode connected to the multiplier circuit input terminal 66 and a cathode connected to the junction of the anode of the third diode 86 and the booster capacitor second plate 84. The storage capacitor 62 is connected between the multiplier circuit input terminal 66 and the junction of the third diode's anode and the output terminal 14. Charge is transferred from the booster capacitor 64 to the storage capacitor 62 when the discharge signal S5 is delivered to the multiplier circuit 12, as explained below.

As can be understood from the description of the multiplier circuit 12, if the charge and discharge signals S6,S5 were allowed to overlap, the power source positive and negative reference terminals 68,30 would be directly connected through the p-channel MOSFET and the second n-channel MOSFET, thereby resulting in undesirable power losses and current spikes. However, this problem is avoided because the time period $T_0,T_1$ always occurs between the charge and discharge signals S6,S5.

INDUSTRIAL APPLICABILITY

In operation, the oscillator means 16 delivers the rectangular-wave signal S1 to the first and second R-C circuit input terminals 22,38. The leading edge of the rectangular-wave signal S1 biases the first diode 32 "off", thereby causing the first capacitor 28 to be charged through the first resistor 26. The second diode 46 is biased "on" by the leading edge of the rectangular-wave signal S1, thereby charging the second capacitor 44 directly through the second diode 46. The respective charge paths of the capacitors 28,44 cause the rise time of the first modified signal S2 to be longer than that of the second modified signal S3.

Conversely, the trailing edge of the rectangular-wave signal S1 biases the first and second diodes 32,46 "on" and "off" respectively. Therefore, the first capacitor 28 rapidly discharges through the first diode 32 and the second capacitor 44 discharges through the second resistor 42. Because of the respective discharge paths of the capacitors 28,44, the first modified signal S2 has a shorter decay time than the second modified signal S3.

The third means 48 receives the first modified signal S2 and produces the discharge signal S5 in response to the first modified signal S2. Because the first modified signal S2 does not immediately rise to the fourth voltage level V4, the leading edge of the discharge signal S5 occurs a first period of time $T_0$ after the leading edge of the rectangular-wave signal S1. This time period $T_0$ corresponds to the time it takes the first modified signal S2 to reach the switching threshold of the inverters 50,56. Furthermore, because the first modified signal S2 decays rapidly to the third voltage level V3, there is no substantial delay between the trailing edges of the rectangular-wave and discharge signals S1,S5.

The fourth means 58 receives the second modified signal S3 and produces the charge signal S6 in response to the second modified signal S3. The leading edge of the charge signal S6 is delayed for a second period of time $T_1$ after the trailing edge of the rectangular-wave signal S1, due to the switching threshold of the inverter 60. However, because the second modified signal S3 rises rapidly from the fifth voltage level V5 to the sixth voltage level V6, there is no substantial time delay between the trailing edge of the charge signal S6 and the leading edge of the rectangular-wave signal S1.

Figure 3:
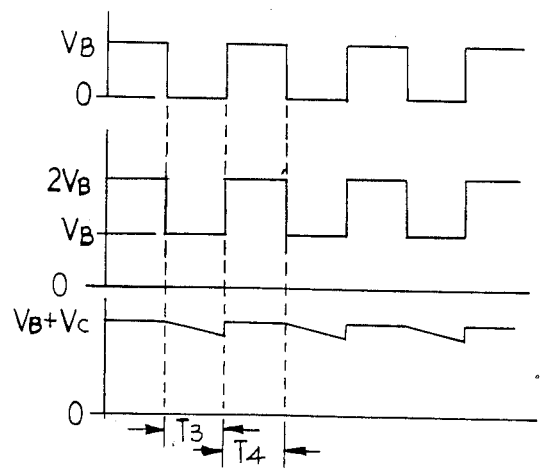
FIG. 3 shows voltage levels at points in the multiplier circuit over time.

Operation of the multiplier circuit can be better understood by referring to FIG. 3. Waveforms W1 and W2 of FIG. 3 illustrate the respective voltage levels at the booster capacitor first and second plates 82,84 over time. Duing a charge cycle T3, when the charge signal is delivered to the multiplier circuit 12, the second n-channel MOSFET 88 is biased "on". Therefore, the booster capacitor first and second plates 82,84 are connected respectively to the power source negative and positive reference terminals 30,68. Thus, during the charge cycle, the booster capacitor has an electrical potential $V_C$ between its second and first plates 84,82, respectively, which is ideally equal in magnitude to the electrical potential $V_B$ of the power source 13.

During a discharge cycle T4, when the discharge signal is delivered to the multiplier circuit 12, the p-channel transistor is biased "on", and the first n-channel MOSFET is biased "off". Therefore, the booster capacitor 64 is serially connected between the multiplier circuit input and output terminals 66,14. More specifically, the booster capacitor first and second plates 82,84 are respectively connected to the multiplier circuit input and output terminals 66,14. When this occurs, the booster capacitor first plate 82 is at the same potential $V_B$ as the power source positive reference terminal, and since the charge across the booster capacitor 64 cannot change instantaneously, the booster capacitor second plate 84 is raised to a potential $V_B + V_C$ which is ideally twice as large as the power source's 13 potential $V_B$. During the discharge cycle T4, charge is transferred from the booster capacitor 64 to the storage capacitor 62 through its connection to the junction of the third diode 86 and the multiplier circuit output terminal 14.

The voltage potential at the multiplier circuit output terminal 14 is illustrated by waveform W3. As can be seen, the output voltage level decays slightly during the charging cycle due to current drawn by an external load (not shown). However, during the discharge cycle, the multiplier circuit output terminal 14 remains at a near constant voltage potential $V_B + V_C$.

Other aspects, objects, and advantages of this invention can be obtained form a study of the drawings, the disclosure, and the appended claims.

I claim:

1. A signal generator apparatus for delivering non-overlapping charge and discharge signals to a voltage multiplier circuit, includes a storage capacitor across which an output voltage potential is produced, a booster capacitor, a discharge switch means for receiving said discharge signal and connecting said booster capacitor in series with an input voltage potential source and across said storage capacitor for transferring charge from said booster capacitor to said storage capacitor, and a charge switch means for receiving said charge signal and delivering said input voltage potential to said booster capacitor for charging, said signal generating apparatus comprising:

oscillator means for producing a rectangular-wave signal which varies at a preselected frequency;

first means for receiving said rectangular-wave signal and producing a first modified signal having rise and decay times responsive respectively to leading and trailing edges of said rectangular-wave signal;

second means for receiving said rectangular-wave signal and producing a second modified signal having rise and decay times responsive respectively to leading and trailing edges of said rectangular-wave signal, and wherein said first modified signal rise time is longer than said second modified signal rise time and said first modified signal decay time is shorter than said second modified signal decay time;

third means for receiving said first modified signal and producing said discharge signal, said discharge signal having leading and trailing edges responsive respectively to said first modified signal rise and decay times during a single cycle of said rectangular-wave signal;

fourth means for receiving said second modified signal and producing said charge signal, said charge signal having a leading edge responsive to said second modified signal decay time of one cycle of said rectangular-wave signal and a trailing edge responsive to said second modified signal rise time of a succeeding cycle of said rectangular-wave signal; and whereby an interval of time occurs between the production of said discharge and charge signals.

2. A signal generating apparatus as set forth in claim 1, wherein said first means includes:

a first R-C circuit having an input terminal connected to said oscillator means and being adapted to receive said rectangular-wave signal, an output terminal connected to said third means and being adapted to produce said first modified signal, a first resistor connected between said input and output terminals, and a first capacitor connected between said output terminal and a source of low voltage potential, a first diode having a cathode and an anode respectively connected to said first R-C circuit input and output terminals, said first diode being adapted to block current flow from said first R-C circuit input terminal to said first R-C circuit output terminal; and whereby said first capacitor is charged through said first resistor and discharges through said first diode thereby producing said first modified signal rise and decay times.

3. A signal generating apparatus as set forth in claim 1, wherein said second means includes:

a second R-C circuit having an input terminal connected to said oscillator means and being adapted to receive said rectangular-wave signal, an output terminal connected to said fourth means and being adapted to produce said second modified signal, a second resistor connected between said input and output terminals and a second capacitor connected between said output terminal and said source of low voltage potential, a second diode having an anode and a cathode respectively connected to said second R-C circuit input and output terminals; and whereby said second capacitor is charged through said second diode and discharged through said second resistor thereby producing said second modified signal rise and decay times.

4. A signal generating apparatus as set forth in claim 1 wherein said third means includes:
first inverter means for receiving said first modified signal and producing a first inverted signal; and
second inverter means for receiving said inverted signal and producing said discharge signal.

5. A signal generating apparatus as set forth in claim 1 wherein said fourth means includes a third inverter means for receiving said second modified signal and producing said charge signal.

6. A method for delivering non-overlapping charge and discharge signals to voltage multiplier circuit of the type having a storage capacitor across which an output voltage is produced, a booster capacitor, a discharge switch means for receiving said discharge signal and connecting said booster capacitor in series with an input voltage potential and in parallel with said storage capacitor for transferring charge from said booster capacitor to said storage capacitor, and a charge switch means for receiving said charge signal and delivering said input voltage potential to said booster capacitor for charging, said method comprising the steps of:
producing a rectangular-wave signal which varies at a preselected frequency;
producing a first modified signal responsive to said rectangular-wave signal, said first modified signal having rise and decay times responsive respectively to leading and trailing edges of said rectangular-wave signal;
producing a second modified signal responsive to said rectangular-wave signal, said second modified signal having rise and decay times responsive respectively to leading and trailing edges of said rectangular-wave signal, and wherein said first modified signal rise time is longer than said second modified signal rise time and said first modified signal decay time is shorter than said second modified signal decay time;
producing said discharge signal responsive to said first modified signal, said discharge signal having leading and trailing edges responsive respectively to said first modified signal rise and decay times during a single cycle of said rectangular-wave signal; and
producing said charge signal responsive to said second modified signal, said charge signal having a leading edge responsive to said second modified signal decay time of one cycle of said rectangular-wave signal and a trailing edge responsive to said second modified signal rise time of a succeeding cycle of said rectangular-wave signal.

* * * * *